Feb. 27, 1968
T. P. SYLVAN
3,371,227
TRANSISTOR-S.C.R. CIRCUITRY PROVIDING A THYRATRON EQUIVALENT
Filed Oct. 18, 1963
2 Sheets-Sheet 1

INVENTOR:
TAGE P. SYLVAN,
BY Urban H. Faubion
HIS ATTORNEY.

Feb. 27, 1968 T. P. SYLVAN 3,371,227

TRANSISTOR-S.C.R. CIRCUITRY PROVIDING A THYRATRON EQUIVALENT

Filed Oct. 18, 1963 2 Sheets-Sheet 2

INVENTOR:
TAGE P. SYLVAN,

BY Urban H. Faubion
HIS ATTORNEY.

United States Patent Office 3,371,227
Patented Feb. 27, 1968

3,371,227

TRANSISTOR-S.C.R. CIRCUITRY PROVIDING A THYRATRON EQUIVALENT

Tage P. Sylvan, Liverpool, N.Y., assignor to General Electric Company, a corporation of New York Filed Oct. 18, 1963, Ser. No. 317,274
7 Claims. (Cl. 307—252)

Figure 1:
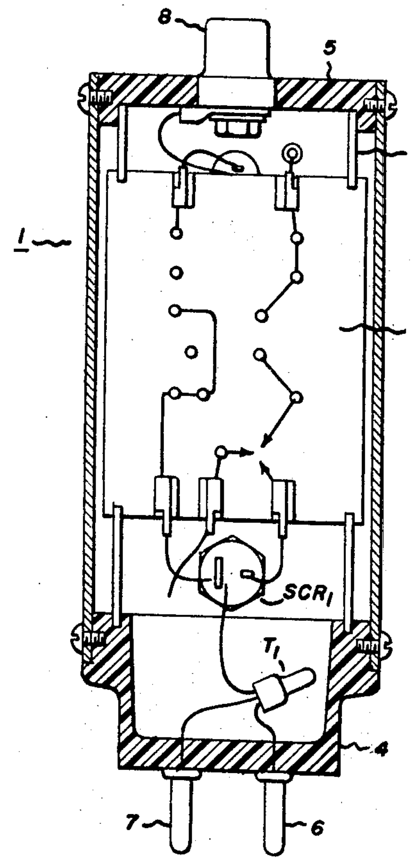

The present invention relates to a solid state switching apparatus and, more specifically, to such an apparatus which can be utilized in a circuit as a direct substitute for an electron discharge device particularly of the type known as a thyratron.

The present invention utilizes a three-terminal solid state switching element such as the silicon controlled rectifier (SCR). Such switching elements are provided with an anode, cathode and gate terminals. In a manner similar to electron discharge devices, the anode and the cathode provide the main current path through the solid state switching device, conventional current flow being through the solid state switching device from anode to cathode. Also in a manner similar to a thyratron the solid state switching device is provided with a gate which allows the device to be switched from its high to its low impedance state in response to a gate signal.

Although the silicon controlled rectifier has been referred to from its inception as the "solid state thyratron" because of the analogous functions performed by the two components, the SCR cannot be utilized as a direct replacement for a thyratron without extensive circuit changes. Since the grid of a thyratron presents a very high input impedance, a low power signal can be utilized for firing in contradistinction to an SCR which presents a relatively low gate impedance thereby necessitating a considerably higher power signal for firing. Because of this difference in the input characteristics of the two devices, prior art silicon controlled rectifier switching devices have not been capable of utilization as direct replacements for thyratrons.

Accordingly, an object of the present invention is to provide a solid state switching apparatus suitable for direct replacement on a thyratron tube.

Another object is to provide a solid state switching apparatus having electrical characteristics similar to those of a thyratron.

Still another object is to provide a solid state plug-in replacement for a thyratron which is compatible with conventional thyratron hardware.

These and other objects are achieved in one embodiment of the invention through the use of a low power transistor having an input impedance of the order of that of a thyratron to trigger a high power silicon controlled rectifier having a relatively low input impedance. In this manner, current sensitivity of the silicon controlled rectifier is increased to more closely approximate the sensitivity of a thyratron. The transistor, silicon controlled rectifier and associated circuit elements are placed in an envelope structure provided with terminal pins (and anode cap where applicable) which may be directly inserted into the tube socket of the thyratron being replaced.

Figure 2:
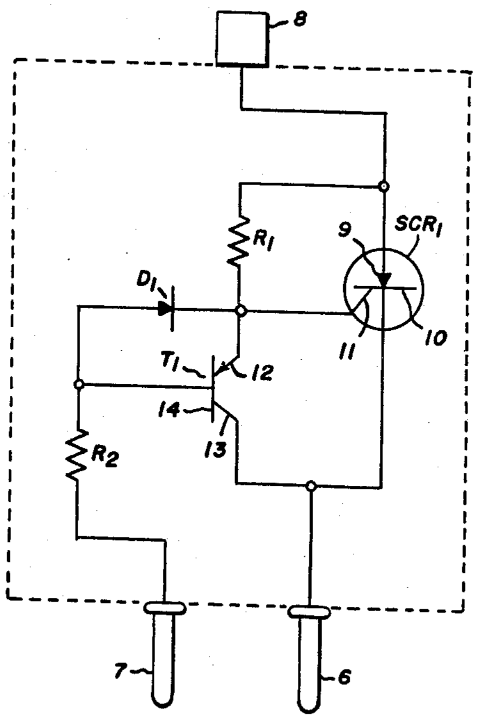
Figure 3:
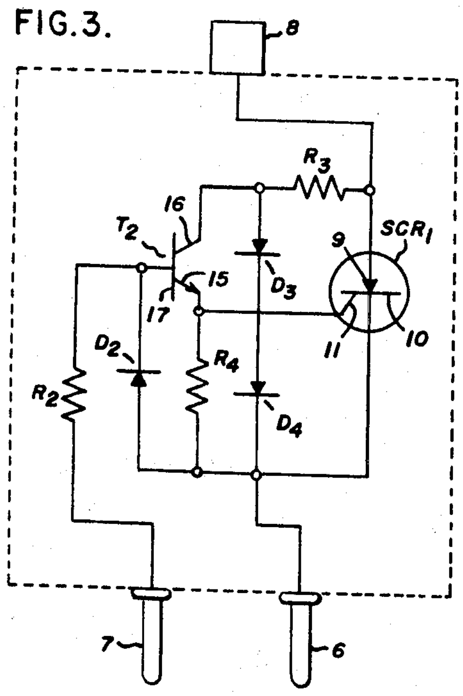
Figure 4:
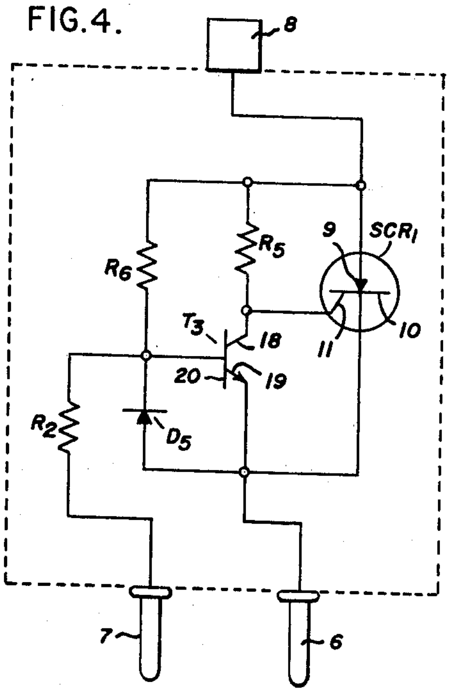
Figure 5:
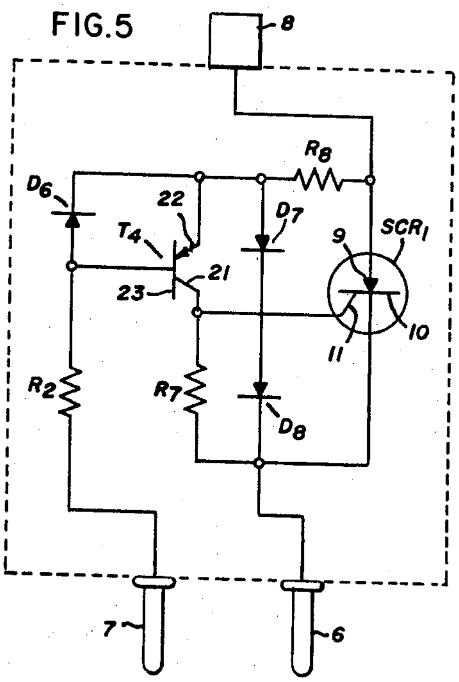

The novel and distinctive features of the invention are set forth in the appended claims. The invention itself, together with further objects and advantages thereof, may best be understood by reference to the following description and accompanying drawings in which:

FIGURE 1 is a cross-sectional view of a representative envelope structure of the present invention, FIGURE 2 depicts, in schematic form, the solid state switching apparatus of the present invention, and FIGURES 3–5 inclusive show schematically other embodiments of the solid state switching apparatus of the present invention.

Referring specifically to FIGURE 1, there is shown a representative structure for a solid state switching apparatus suitable for plug-in replacement of a thyratron. The assembly comprises a silicon controlled rectifier $SCR_1$ having a high power capability, the SCR being triggered by a low power PNP transistor $T_1$ which has an input impedance of the order of the grid impedance of the thyratron to be replaced. The silicon controlled rectifier $SCR_1$ and the transistor $T_1$ are mounted within envelope 1 along with associated circuit elements, connections being made between various elements through the use of a printed circuit board 2 mounted upon a channel member 3. The envelope 1 is provided with a base member 4 and a cap member 5 which fixedly retain the channel member 3. Terminal pins 6 and 7 are provided in the base member 4, the pins 6 and 7 being electrically connected to the transistor $T_1$ and corresponding directly to the cathode and grid pins respectively of the thyratron being replaced. An anode terminal or connector 8 is provided at the opposite end of the assembly and is affixed to the cap member 5. Electrical connection is effected to the anode of $SCR_1$ so that anode connector 8 corresponds directly to the anode terminal of the thyratron being replaced. The base member 4 may further be provided with dummy terminal pins to be received by the apertures in the thyratron socket which are utilized to provide filament connections to the thyratron. Thus a compact, integrated assembly is provided which is completely compatible with the conventional thyratron hardware.

It should be appreciated that although an embodiment has been shown wherein an anode cap is utilized as employed in relatively high voltage devices, other conventional arrangements might be utilized such as are employed in lower voltage thyratrons wherein the anode terminal extends from the base of the assembly in a manner similar to the grid and cathode terminals.

Referring to FIGURE 2, there is shown in schematic form one embodiment of a circuit suitable for incorporation in the assembly of FIGURE 1 to provide direct replacement of a thyratron. Corresponding elements in the two figures are given the same reference numerals. $SCR_1$ is a high power SCR having equivalent power handling capabilities to that of the thyratron being replaced. Anode 9 and cathode 10 of $SCR_1$ are connected between the device cathode terminal 6 and anode terminal 8 respectively as depicted in the assembly of FIGURE 1. Note that the arrow of the symbol for silicon controlled rectifiers and diodes points in the direction of normal conventional current flow through the device. Thus, normal current flow through $SCR_1$ is from the anode terminal 8 to the cathode pin 6.

The triggering electrode, gate 11, of $SCR_1$ is connected to the emitter 12 of a PNP transistor $T_1$. The particular transistor is selected for its sensitivity and its input impedance to approximate the characteristics of a thyratron. The emitter 12 of the transistor $T_1$ is connected through a suitable current limiting resistor $R_1$ to the device anode terminal 8, the collector 13 of the transistor $T_1$ being connected to the cathode 10 of $SCR_1$. The base 14 of the transistor $T_1$ is connected through a resistance $R_2$ to the device grid terminal 7, a diode $D_1$ being connected between the base 14 and emitter 12 of transistor $T_1$ to clamp the reverse voltage on the base of the transistor. The diode $D_1$ is unnecessary if the maximum input voltage between device terminal pins 6 and 7 does not exceed the emitter-to-base breakdown voltage of the transistor $T_1$.

In the solid state switching apparatus as described the operation is such that a positive signal, such as is utilized to fire the thyratron being replaced, applied to the grid pin 7 will cause $SCR_1$ to fire. If the voltage on the grid pin 7 is sufficiently negative with respect to the cathode pin 6, the transistor $T_1$ will be in saturation and the current flowing through the resistor $R_1$ will be diverted through the transistor to the cathode pin 6. Thus, the current is shunted from the gate 11 of $SCR_1$ and this element remains in its high impedance state. This is clear since the saturation voltage of the transistor is below the minimum gate firing voltage of the SCR and $SCR_1$ cannot be fired while the transistor is in saturation. If the voltage at the grid pin 7 is increased, the base current of transistor $T_1$ will decrease and the transistor will come out of saturation, thereby causing the current flowing through resistance $R_1$ to flow into the gate 11 of $SCR_1$ and thus causing the SCR to switch to its low impedance state. The resistor $R_1$ is chosen to have a value low enough to supply the maximum gate current required to fire $SCR_1$ at the minimum anode to cathode voltage desired.

As the voltage at grid pin 7 becomes more positive than the voltage at cathode pin 6, the emitter 12 of transistor $T_1$ is reversed biased and the transistor is completely cut off, thereby directing all the current flowing through $R_1$ to the gate electrode 11 of $SCR_1$.

Thus, it is seen that the solid state switching apparatus of FIGURE 2 can be fired by a low level positive signal such as is utilized to fire a thyratron and thus the apparatus of FIGURE 2 can be utilized as a direct plug-in replacement for a thyratron.

The voltage necessary at the grid pin 7 for firing $SCR_1$ is found to be a function of the anode voltage and the current gain of transistor in accordance with the equation:

$$V_{GF}=\frac{R_2}{h_{FE}}\left(\frac{V_{AC}}{R_1}-I_{GF}\right) \quad (1)$$

where $V_{GF}$ is the voltage between grid pin 7 and cathode pin 6 at which the SCR fires, $I_{GF}$ is the gate current required to fire $SCR_1$, $V_{AC}$ is the instantaneous anode to cathode voltage necessary to fire $SCR_1$ and $h_{FE}$ is the current gain of the transistor. It is, of course, possible to make the apparatus of FIGURE 2 independent of anode voltage through the use of a Zener diode (not shown) connected between an intermediate point of the resistance $R_1$ and the cathode pin 6 to establish a reference voltage across the transistor $T_1$.

It is readily apparent that the transistor $T_1$ need only have a very low voltage rating since the maximum voltage across the transistor will be maintained at a low level.

Thus, a semiconductor switching apparatus is provided which serves as a plug-in replacement for a thyratron while at the same time eliminating the undesirable characteristics of a thyratron such as the requirement for filament power, fragility, and a relatively high forward voltage drop. Further, such an apparatus exhibits a much greater reliability and longer life than the equivalent thyratron.

A similar action and function is provided by the other circuits illustrated and described herein. In order to simplify the description and drawings, components of the FIGURES 3–5 which correspond to those of FIGURE 2 are given like reference numerals.

Referring to the schmatic diagram of FIGURE 3, the controlled rectifier $SCR_1$ is again selected to have equivalent power handling capabilities to that of the thyratron being replaced. Anode 9 and cathode 10 of $SCR_1$ are connected to anode terminal 8 and cathode pin 6 respectively in the same manner as discussed in connection with FIGURE 2. The triggering electrode gate, 11, of $SCR_1$ is connected to the emitter 15 of an NPN transistor $T_2$. The particular transistor is again chosen as discussed in connection with FIGURE 2 to approximate the sensitivity and input impedance of the thyratron being replaced. The transistor $T_2$ is connected in the emitter follower configuration, the collector 16 being connected to the anode terminal 8 through a suitable current limiting resistance $R_3$. The emitter 15 in addition to being connected to the gate 11 of $SCR_1$ is connected through a load resistance $R_4$ to the cathode 10 of $SCR_1$. The base 17 of transistor $T_2$ is connected to the grid pin 7 through a resistance $R_2$ as discussed in connection with FIGURE 2, a diode $D_2$ being connected between the emitter 15 and base 17 of transistor $T_2$ to clamp the reverse voltage on the base of the transistor in order to protect the transistor. A pair of serially-connected diodes $D_3$ and $D_4$ are connected between the collector 16 of transistor $T_2$ and the cathode pin 6 to limit the collector voltage. As an alternative the diodes $D_3$ and $D_4$ might be replaced by a single Zener diode (not shown) connected in reverse polarity to that shown for diodes $D_3$ and $D_4$.

The solid state switching apparatus as shown in FIGURE 3 differs from that of FIGURE 2 primarily in the substitution of an NPN transistor for PNP transistor $T_1$. The operation is such that a positive signal, such as is utilized to fire the thyratron being replaced, applied to the grid pin 7 will cause $SCR_1$ to fire. Normally in the absence of a signal at the grid pin 7 transistor $T_2$ is cut off. The application of a positive signal to the grid pin 7 causes the transistor $T_2$ to conduct thereby developing a positive pulse across the load resistance $R_4$ which is applied to the gate 11 of $SCR_1$ to cause switching of the SCR to its low impedance state.

Referring to FIGURE 4, there is shown schematically a solid state switching apparatus similar to that depicted in FIGURE 2 wherein an NPN transistor is utilized rather than a PNP transistor as depicted in FIGURE 2. Further, the circuit of FIGURE 4 is triggered by applying a negative signal at the grid pin 77 in contradistinction to the circuit of FIGURE 2 which is triggered by a positive signal. A negative signal, of course, cannot be utilized to trigger the thyratron being replaced; however, negative triggering as made possible by the circuit of FIGURE 2, is desirable in the interests of flexibility of circuit design.

The gate electrode 11 of $SCR_1$ is connected to the collector 18 of NPN transistor $T_3$. The collector of transistor $T_3$ is connected through a suitable current-limiting resistance $R_5$ to the anode terminal 8, the emitter 19 of transistor $T_3$ being connected to the cathode pin 6. The base 20 of transistor $T_3$ is connected to grid pin 7 through resistance $R_2$ as discussed in connection with FIGURE 2. A resistance $R_6$ is connected between the base 20 and anode terminal 8 of transistor $T_3$ to insure that the transistor will be maintained in saturation in the absense of an input signal at the grid pin 7. A diode $D_5$ is connected between the base 20 and emitter 19 of transistor $T_3$ to clamp the reverse voltage on the base of the transistor at a safe level.

The operation of the circuit of FIGURE 4 is similar to that discussed in connection with the circuit of FIGURE 2, except that a negative signal is employed for triggering. In the absence of a negative triggering signal at grid pin 7 the transistor $T_3$ is saturated, thereby shunting the current from the gate electrode 11 of $SCR_1$. When a negative signal is applied to grid pin 7, transistor $T_3$ is cut off, thereby directing the current flowing through resistance $R_5$ to the gate electrode 11 of $SCR_1$ causing this element to switch to its low impedance state.

Referring to FIGURE 5 there is shown schematically an apparatus similar to that of FIGURE 3 wherein a PNP transistor is utilized rather than an NPN transistor as depicted in FIGURE 3. Again, as discussed in connection with FIGURE 4 a negative signal is employed for triggering the circuit of FIGURE 5 in contradistinction to the positive triggering of the circuit of FIGURE 3. A PNP transistor $T_4$ is connected in the common emitter configuration, collector 21 of transistor $T_4$ being connected to the gate electrode 11 of $SCR_1$ and through a suitable low resistance $R_7$ to the cathode pin 6. The emitter 22 of transistor $T_4$ is connected through a suitable current-limiting resistance $R_8$ to the anode terminal 8 in the manner discussed in connection with the previous figures. The base 23 of transistor $T_4$ is connected through resistance $R_2$ to grid pin 7, the base 23 of transistor $T_4$ also being connected through a clamping diode $D_6$ to the emitter 22. As discussed in connection with FIGURE 3, a pair of serially-connected diodes $D_7$ and $D_8$ are connected between the emitter 22 of transistor $T_4$ and cathode pin 6 to limit the voltage appearing across the transistor.

The operation of the circuit of FIGURE 5 is similar to that discussed in connection with FIGURE 3; however, a negative signal is necessary for firing, the PNP transistor $T_4$ normally being cut off with a positive signal at the grid pin 7. The application of a negative triggering signal to the base 23 of transistor $T_4$ causes the transistor $T_4$ to conduct, thereby developing a positive triggering pulse across the load resistance $R_7$, the pulse being applied to the gate electrode 11 of $SCR_1$ to cause this element to switch to its low impedance state.

Although the invention has been described with respect to certain specific embodiments, it will be appreciated that modifications and changes may be made by those skilled in the art without departing from the spirit of the invention. Therefore, it is intended by the appended claims to cover all such modifications and changes that fall within the true spirit and scope of the invention.

What is claimed as new and desired to be secured by Letters Patent of the United States is:

1. A solid state switching apparatus capable of being utilizable in a circuit as a direct substitute for a thyratron, said apparatus comprising:

(A) an envelope structure provided with at least first, second and third terminals adapted to be received by conventional thyratron-receiving terminals and corresponding directly to the anode, cathode, and control grid terminals respectively of the thyratron, (B) a silicon controlled rectifier mounted within said envelope and having relatively high power handling capability and relatively low input impedance with respect to the thyratron, (1) said silicon controlled rectifier having anode, cathode and gate electrodes.

(C) a transistor mounted within said envelope and having relatively low power handling capability and relatively high input impedance with respect to said silicon controlled rectifier, said transistor having first, second and base electrodes, (D) said first and second electrodes of said transistor being connected so as to define a path in shunt with said anode and cathode of said controlled rectifier, (1) said shunt path including series resistance, (E) said first electrode of said transistor being connected to said gate electrode of said controlled rectifier, (F) said anode and cathode electrodes of said silicon controlled rectifier being coupled to said first and second terminals respectively, and (G) said base of said transistor being coupled to said third terminal.

2. A solid state switching apparatus as defined in claim 1 wherein said transistor is of the PNP type, said first, second and base electrodes being the emitter, collector and base electrodes respectively of said transistor, said emitter being connected to said anode of said silicon controller rectifier through a series resistance, and said collector being connected to said cathode of said silicon controlled rectifier.

3. A solid state switching apparatus as defined in claim 2 wherein said transistor is normally saturated and including means for applying a positive polarity signal to said third terminal for rendering said transistor nonconductive to cause gating of said silicon controlled rectifier.

4. A solid state switching apparatus as defined in claim 1 wherein said transistor is of the PNP type, said first, second and base electrodes being the collector, emitter and base electrodes respectively of said transistor, said emitter being connected to said anode of said silicon controlled rectifier through a series resistance and said collector being connected to said cathode of said silicon controlled rectifier through a series resistance.

5. A solid state switching apparatus as defined in claim 4 wherein said transistor is normally cut-off and including means for applying a negative polarity signal to said third terminal for rendering said transistor conductive to cause gating of said silicon controlled rectifier.

6. A solid state switching apparatus as defined in claim 1 wherein said transistor is of the NPN type, said first, second and base electrodes being the collector, emitter and base electrodes respectively of said transistor, said collector being connected to said anode of said silicon controlled rectifier through a series resistance and said emitter being connected to said cathode of said silicon controlled rectifier.

7. A solid state switching apparatus as defined in claim 1 wherein said transistor is of the NPN type, said first, second and base electrodes being the collector, emitter and base electrodes of said transistor respectively, said collector being connected to said anode of said silicon controlled rectifier through a series resistance and said emitter being connected to said cathode of said silicon controlled rectifier through a series resistance.

References Cited

UNITED STATES PATENTS

| | | | |
|---|---|---|---|
| 2,986,675 | 5/1961 | Burson et al. | 317—101 |
| 3,049,642 | 8/1962 | Quinn | 315—206 |
| 3,131,318 | 4/1964 | Snyder et al. | 307—88.5 |
| 3,179,814 | 4/1965 | Stoudenmire et al. | 307—88.5 |
| 3,182,201 | 5/1965 | Sklar | 307—88.5 |

OTHER REFERENCES

SCR manual, second edition, pp. 72 and 116, published 1961 by General Electric Co., Rectifier and Components Department, Auburn, N.Y.

R. R. Rottier: A.I.E.E District Conference Paper, entitled "A Packaged SCR Circuit for Direct Thyratron Replacement," presented at the Empire Tri-District Meeting, Erie, Pa., May 14–16, 1962, Paper No. DP62–1013.

JOHN W. HUCKERT, *Primary Examiner.*

DAVID J. GALVIN, *Examiner.*

R. F. SANDLER, *Assistant Examiner.*